(12) United States Patent
Kraus

(10) Patent No.: US 8,950,211 B2
(45) Date of Patent: Feb. 10, 2015

(54) ARRANGEMENT FOR AIR CONDITIONING OF SUBASSEMBLIES

(75) Inventor: Harald Kraus, Lauingen (DE)

(73) Assignee: Siemens Aktiengesellschaft, Munich (DE)

(*) Notice: Subject to any disclaimer, the term of this patent is extended or adjusted under 35 U.S.C. 154(b) by 1615 days.

(21) Appl. No.: 12/309,631

(22) PCT Filed: May 14, 2007

(86) PCT No.: PCT/EP2007/054658
§ 371 (c)(1),
(2), (4) Date: Jan. 26, 2009

(87) PCT Pub. No.: WO2008/012119
PCT Pub. Date: Jan. 31, 2008

(65) Prior Publication Data
US 2009/0235685 A1   Sep. 24, 2009

(30) Foreign Application Priority Data

Jul. 24, 2006  (DE) .......................... 10 2006 034 156

(51) Int. Cl.
*F25D 17/06*  (2006.01)
*F04D 29/58*  (2006.01)
(Continued)

(52) U.S. Cl.
CPC .......... *F04D 29/582* (2013.01); *F04D 29/4246* (2013.01); *H05K 7/20181* (2013.01); *H05K 7/20618* (2013.01)
USPC .......................................................... 62/426

(58) Field of Classification Search
CPC ..... F04D 29/582; F04D 29/4246; B60H 1/14; H05K 7/20181; H05K 7/20618
USPC ............... 62/69, 89, 280, 298, 310, 317, 325, 62/404, 408, 419, 424–429, 507; 165/48.1, 54, 59, 80.3, 86, 96, 122, 165/125, 135, 240; 416/63, 142, 146 R, 184, 416/204, 244 R, 246, 247 R; 310/57–59, 310/62–65, 144; 415/203–207, 126–128, 415/143, 175, 221.1; 417/234, 366, 368, 417/370, 423.1, 423.14, 423.15, 423.7, 417/411; 454/125, 153, 201–227, 256, 454/261–268, 274–283, 285, 296–327, 454/184; 55/385.1, 385.2, 385.4, 405–485, 55/506, 524; 361/719; 98/2.08
See application file for complete search history.

(56) References Cited

U.S. PATENT DOCUMENTS

| | | | | | |
|---|---|---|---|---|---|
| 4,476,773 | A | * | 10/1984 | Fehr | .............................. 454/121 |
| 5,136,802 | A | * | 8/1992 | Chen | ............................... 43/111 |
| 7,004,833 | B2 | * | 2/2006 | Merlet et al. | .................. 454/184 |

FOREIGN PATENT DOCUMENTS

| | | | |
|---|---|---|---|
| CA | 2263265 A1 | * | 9/1999 |
| DE | 199 56 038 A1 | | 5/2001 |

(Continued)

OTHER PUBLICATIONS

International Search Report for Application No. PCT/EP2007/054658; mailed Nov. 7, 2007.
(Continued)

*Primary Examiner* — Frantz Jules
*Assistant Examiner* — Emmanuel Duke
(74) *Attorney, Agent, or Firm* — Staas & Halsey LLP

(57) ABSTRACT

Subassemblies are arranged in the interior of a closed housing. The housing has an air inlet via which air-conditioning air is guided into the interior of the housing. The housing contains a fan via which the air used for the air conditioning of the subassemblies is guided to the outside from the interior of the housing. In addition to a fan input opening, the fan has at least two fan output openings wherein a rotatably mounted screen is arranged in the interior of the fan. By variably adjusting the position of the screen, the air sucked in via the fan input openings is optically guided via at least one of the fan output openings.

8 Claims, 5 Drawing Sheets

(51) Int. Cl.
*F04D 29/42* (2006.01)
*H05K 7/20* (2006.01)

(56) References Cited

FOREIGN PATENT DOCUMENTS

| EP | 1 657 447 A2 | 5/2006 | | |
|---|---|---|---|---|
| JP | 10-196989 | * | 7/1998 | ............... F24F 1/00 |
| JP | 2001-111277 | | 4/2001 | |
| JP | 2002-57480 | | 2/2002 | |

OTHER PUBLICATIONS

German translation of Japanese Office Action issued Feb. 21, 2011 in corresponding Japanese Patent Application 2009-521174.

* cited by examiner

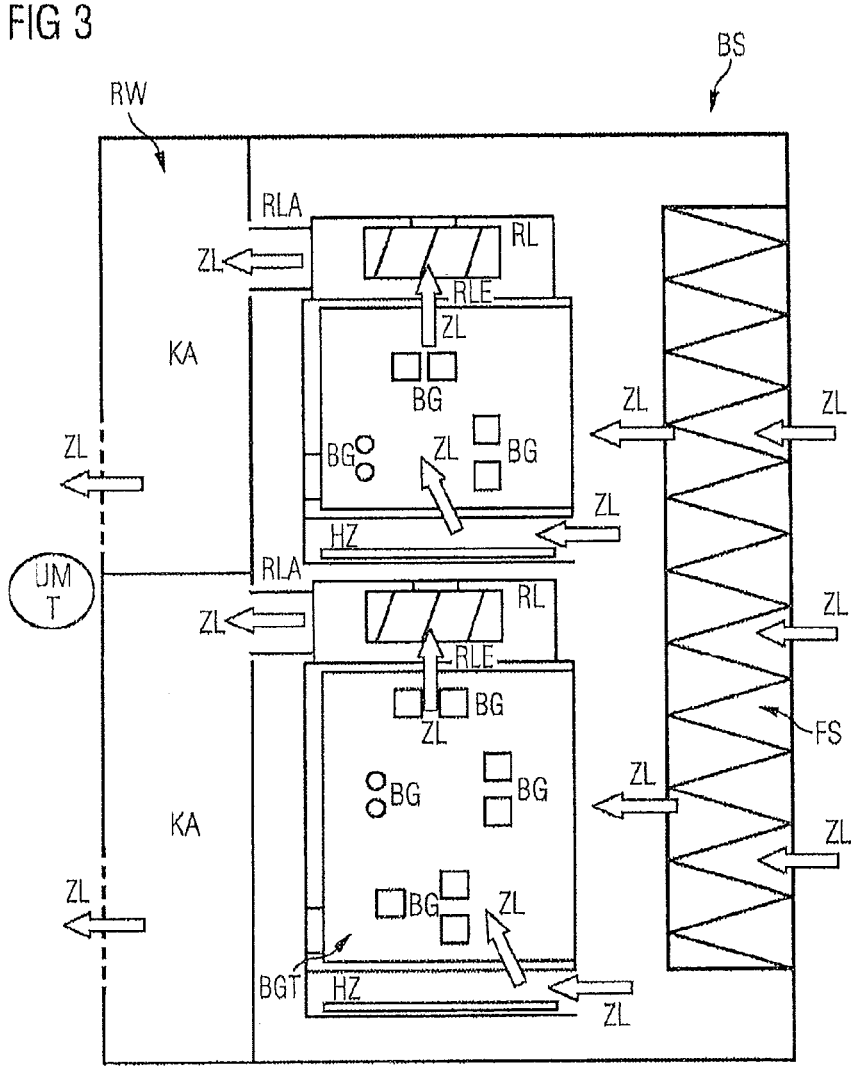

ARRANGEMENT FOR AIR CONDITIONING OF SUBASSEMBLIES

CROSS REFERENCE TO RELATED APPLICATIONS

This application is based on and hereby claims priority to German Application No. 10 2006 034 156.2 filed on Jul. 24, 2006, the contents of which are hereby incorporated by reference.

BACKGROUND

Described below is an arrangement for the air conditioning of subassemblies, in particular electrical subassemblies, in a closed housing.

Air conditioning solutions are known in which fans are used for the ventilation or air conditioning of electrical subassemblies in base stations.

FIG. 3 shows an exemplary first air conditioning solution according to the related art, with reference to a mobile telephony base station.

In the case of this air conditioning solution a radial fan RL is used as a fan.

Electrical subassemblies BG which must be cooled or heated depending on the ambient temperature T are arranged on a rack BGT in the interior of a base station housing BS.

By operation of the radial fan RL, air ZL in the form of incoming air is sucked into the interior of the base station housing BS via a filter system FS.

In this arrangement the filter system FS prevents any unwanted penetration of dust and contaminant particles. This is necessary because air humidity combined with the contaminant particles within the base station housing BS would result in corrosion.

The air ZL reaches the subassemblies BG via a switchable heating entity HZ, and can therefore be used for both cooling and heating the subassemblies BG. The air ZL which is used for the air conditioning of the subassemblies BG is then guided into the interior of the radial fan RL via an inlet RLE of the radial fan RL.

The base station housing BS has a so-called "standard" backplane RW which is divided into chambers KA. This backplane RW is embodied in such a way that the air ZL which is used for the air conditioning reaches a chamber KA of the backplane RW from the interior of the base station housing BS via an outlet RLA of the radial fan RL.

The chamber KA is in turn connected to the environment UM, such that the air ZL which is used for the air conditioning of the base station housing BS is guided into the environment UM as discharge air.

In the case of ambient temperatures T of typically T<0° Celsius, the air ZL is heated by the heating entity HZ in order that selected subassemblies BG can be heated accordingly. To that end, electrical heating entities HZ which are assigned in each case in proximity to the subassemblies BG and can be controlled independently of each other are provided in the interior of the base station housing BS.

In the case of this air conditioning solution, additional costs are incurred during operation as a result of the electrical heating energy that is required.

FIG. 4 shows an exemplary second air conditioning solution according to the related art, with reference to a mobile telephony base station. In this case, too, a radial fan RL is again used as a fan.

In comparison with the embodiment described in FIG. 3, a modified backplane RWM is used here, the backplane being likewise divided into chambers KA.

Each chamber KA has a further opening or connection VE which can be closed in a controllable manner by a flap KL. The flap KL connects the chamber KA to the interior of the base station housing BS.

The flap KL allows air, which has already been heated by the subassemblies BG in a first pass, to be routed out of the chamber KA back into the interior of the base station housing BS, and to be used for heating the subassemblies BG again in a second pass.

In other words, air ZL which is used for the air conditioning undergoes a cyclical flow:
  air ZL which is sucked in arrives at the radial fan RL via the subassemblies BG and the heating entities HZ that are assigned in each case;
  the air arrives in respective chambers KA of the backplane RWM via the outlet RLA of the radial fan RL;
  air from the chambers KA can then—controlled by the flap KL—be used again for the air conditioning of the subassemblies BG and/or diverted into the environment UM.

The requirement for electrical heating energy is reduced by the flaps KL and the chambers KA and the air circulation that can be controlled thereby. In addition, a reduction of the relative air humidity can be achieved in the interior of the base station housing BS.

The controllable flaps KL are driven by electric motors M, these being controlled by what is called a "controller board". The "controller board" controls the air conditioning in the interior of the base station housing BS or the air conditioning of the subassemblies BG with the aid of sensors which are not shown here.

However, this second air conditioning solution generally does not allow retrofitting to existing base station housings which are already in service. It is not usually possible to replace the backplane of the base station housing with a modified backplane of the type described hereintofore.

SUMMARY

An aspect is an arrangement for the air conditioning of subassemblies in a housing, wherein it is also to be possible for the arrangement to be implemented in existing housings or base station housings retrospectively at modest expense.

In the arrangement for the air conditioning of subassemblies in a closed housing, the subassemblies are arranged in the interior of the housing. The housing has an air intake via which air conditioning air is guided into the interior of the housing. The housing contains a fan by which the air that is used for the air conditioning of the subassemblies is guided from the interior of the housing to the outside. In addition to a fan inlet, the fan has at least two fan outlets. A rotatably mounted screen is arranged in the interior of the fan, wherein the variably adjustable position of the screen optionally guides the air, which is sucked in via the fan inlet, via at least one of the fan outlets.

By virtue of the arrangement, retrospective replacement of a backplane of a base station housing can be avoided. For retrofitting purposes it is merely necessary to replace the fan, which is embodied as a radial fan, with a modified fan having a screen.

In the event of retrofitting it is usually easy to replace the "controller board" which is arranged in the base station housing.

In its housing, the fan used contains a rotatably mounted screen and a device for rotating the screen.

Using the fan with screen embodied as described herein, it is possible variably to adjust blow directions between a first blow direction (e.g. to the outside into the environment) and a second blow direction (e.g. back into the interior of the base station housing).

Using the rotatably mounted screen which is integrated in the fan or radial fan it is possible to select between two or more defined blow directions.

The screen is advantageously mounted such that it can be rotated about the longitudinal axis of the fan. The screen is variably rotated or adjusted with the aid of a servomotor or a manually adjustable drive mechanism.

It is also possible to activate the servomotor via the "controller board" with the aid of an interface which is integrated in the fan.

In the event of a drive failure the screen is positioned with the aid of spring force such that a blow direction is set.

BRIEF DESCRIPTION OF THE DRAWINGS

These and other aspects and advantages will become more apparent and more readily appreciated from the following description of the exemplary embodiments, taken in conjunction with the accompanying drawings of which:

FIG. 3 is a plan view of the exemplary first air conditioning solution according to the related art and as described in the introduction.

DETAILED DESCRIPTION OF THE PREFERRED EMBODIMENT

Figure 1:
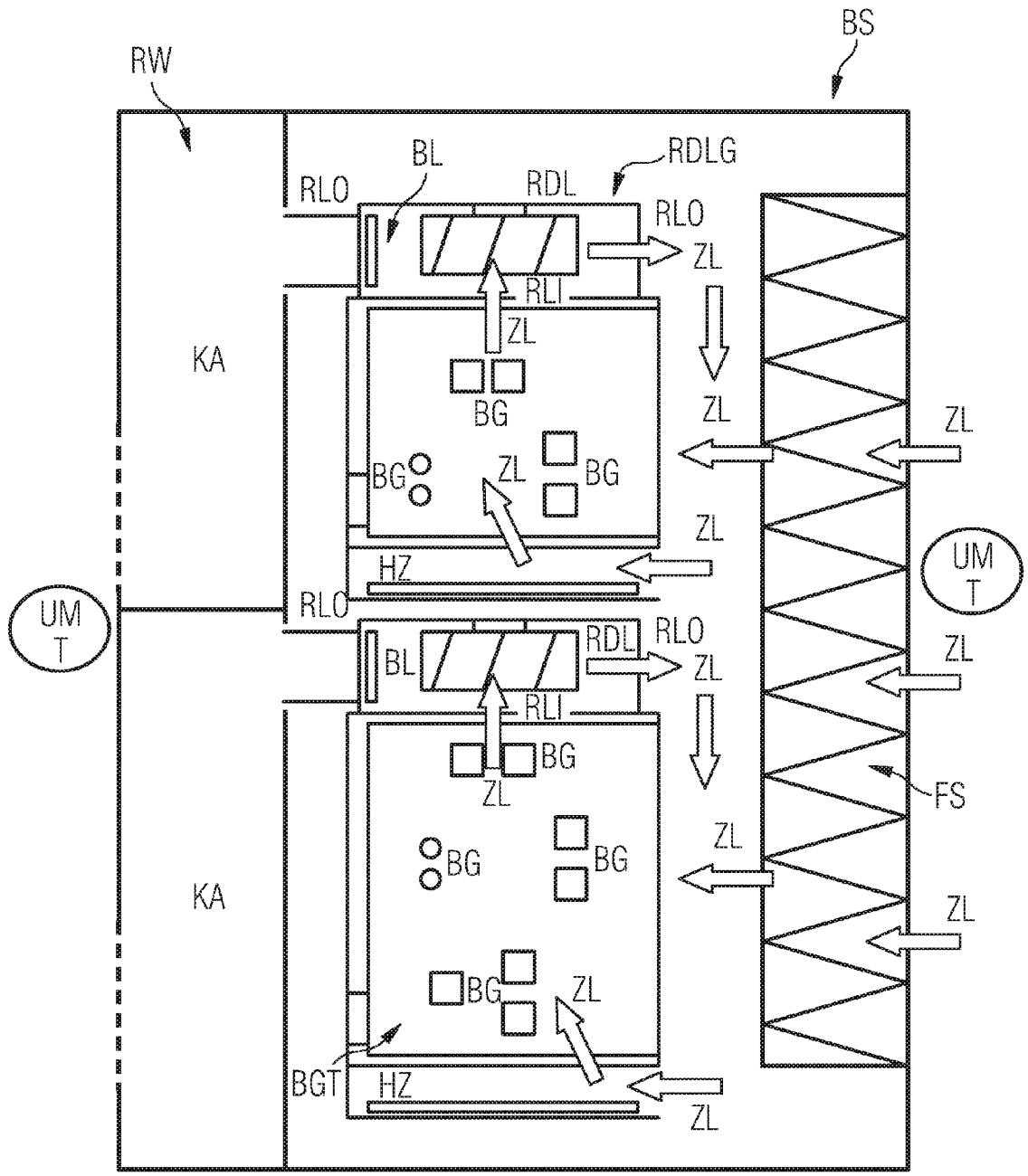
FIG. 1 is a plan view of an embodiment of an arrangement for the air conditioning of subassemblies with reference to an exemplary base station housing.

Reference will now be made in detail to the preferred embodiments, examples of which are illustrated in the accompanying drawings, wherein like reference numerals refer to like elements throughout.

FIG. 1 shows an embodiment of the arrangement for the air conditioning of subassemblies BG with reference to an exemplary base station housing BS.

A modified radial fan RDL is used as a fan in this case.

Electrical subassemblies BG which must be cooled or heated depending on the ambient temperature T are arranged on a rack BGT in the interior of the base station housing BS.

Using the radial fan RDL, air ZL in the form of incoming air is sucked into the interior of the base station housing BS via a filter system FS.

In this case the filter system FS prevents any unwanted penetration of dust and contaminant particles. This is necessary because air humidity combined with the contaminant particles within the base station housing BS would result in corrosion.

The air ZL reaches the subassemblies BG via a switchable heating entity HZ, and can therefore be used for both cooling and for warming or heating the subassemblies BG. The air ZL which is used for the air conditioning of the subassemblies BG is then guided into the interior of the radial fan RDL via an inlet RLI.

The base station housing BS has a backplane RW which is divided into chambers KA. This backplane RW is embodied in such a way that the air ZL which is used for the air conditioning can reach a chamber KA of the backplane RW via an outlet RLO of the radial fan RDL. The chamber KA is in turn connected to the environment UM of the base station housing BS, such that the air ZL which is used for air conditioning can leave the base station housing BS as discharge air.

In the case of ambient temperatures $T<0°$ Celsius, the air ZL is warmed via the heating entity HZ in order that a number of subassemblies BG can be heated accordingly.

In its interior or in the radial fan housing RDLG, the modified radial fan RDL contains a screen BL which is mounted rotatably about the longitudinal axis of the fan and is described in greater detail below.

In this case the screen BL can either have at least one opening, such that depending on the orientation of the screen BL and its opening, the air can be blown into the interior of the base station housing BS and/or into the chambers KA of the backplane RW via respective outlets RLO.

Alternatively, the screen BL can be implemented as a sealing panel without openings, wherein the two ends of the screen establish at least one blow direction in conjunction with openings of the radial fan housing RDLG which surrounds the screen BL.

FIGS. 2A-2D are four illustrations showing the modified radial fan which is used in the case of the arrangement.

Figure 2A:
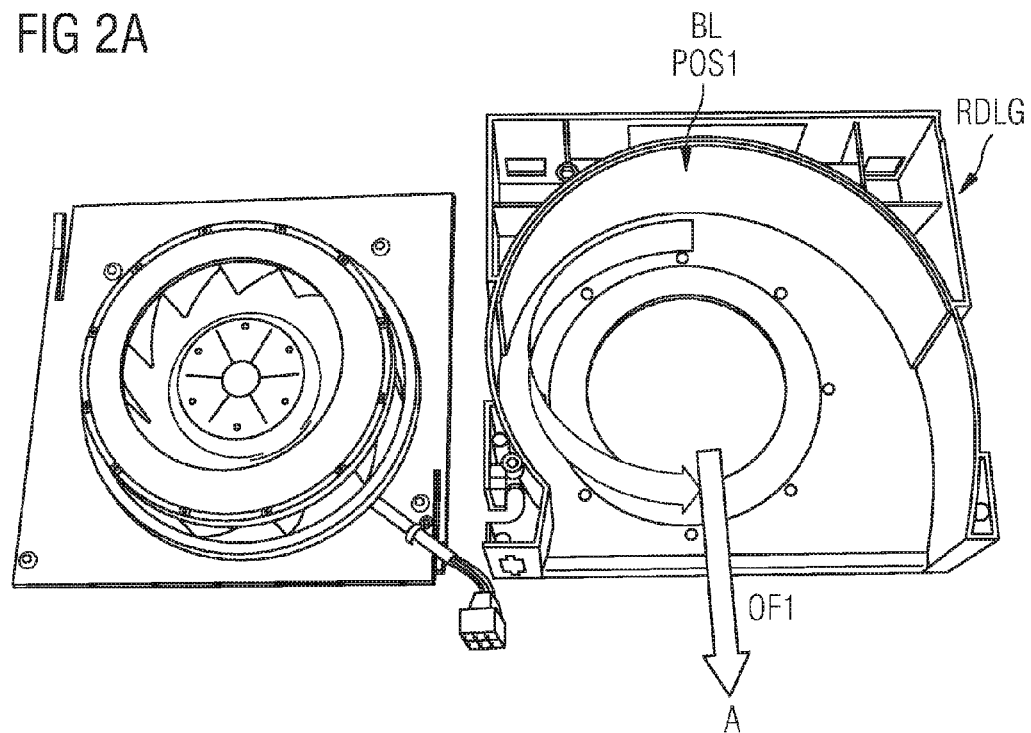
FIGS. 2A to 2D are perspective views of a radial fan for use in the arrangement.

FIG. 2A shows the rotatably mounted screen BL, which is implemented as a sealing panel, in a first position POS1. In this first position POS1, the air which is supplied to the radial fan RDL is blown out in a first blow direction A. The setting of the blow direction A is effected by an opening OF1 which is provided for this purpose in the radial fan housing RDLG, and by the positioning of the ends of the screen BL in relation to the opening OF1.

Figure 2B:
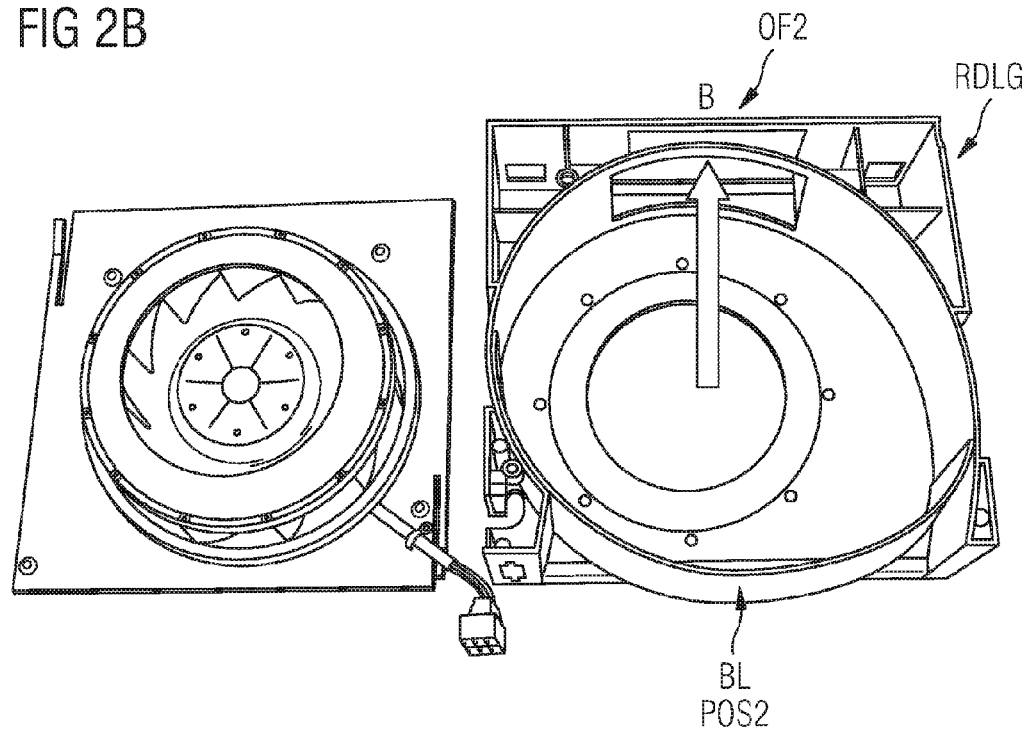

FIG. 2B shows the rotatably mounted screen BL in a second position POS2. In this second position POS2, the air which is supplied to the radial fan RDL is blown out in a second blow direction B via an opening OF2 which is provided for this purpose in the radial fan housing RDLG. The setting of the blow direction B is effected by the opening OF2 which is provided for this purpose in the radial fan housing RDLG, and by the positioning of the ends of the screen BL in relation to the opening OF2.

Figure 2C:
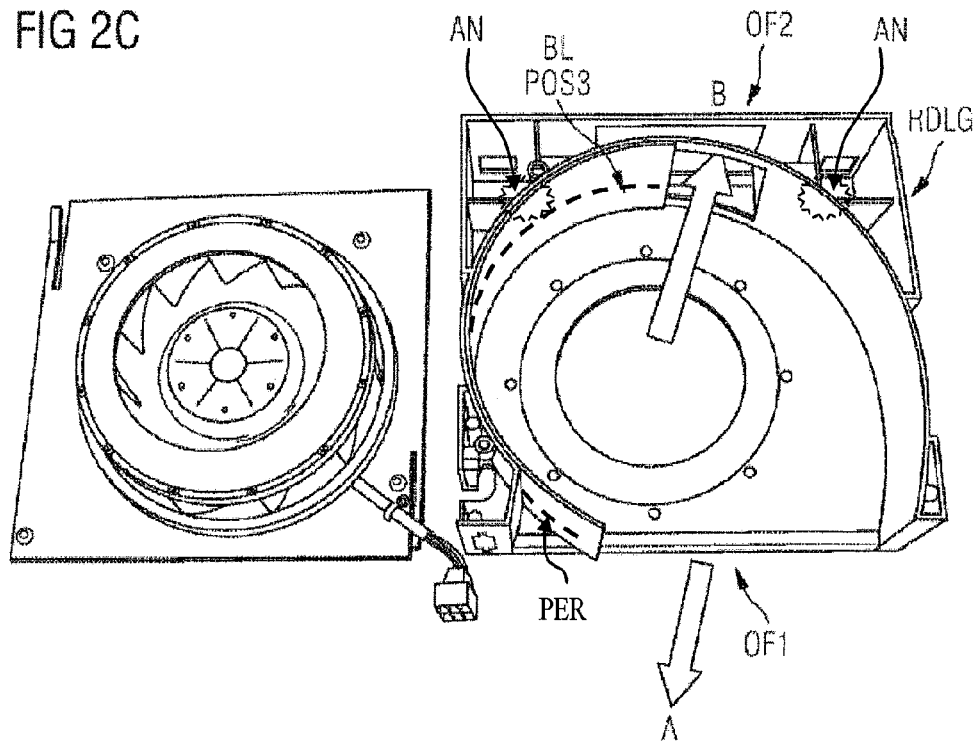

FIG. 2C shows the rotatably mounted screen BL in a third position POS3. In this third position POS3, the air which is supplied to the radial fan RDL is blown out in both the first blow direction A and the second blow direction B. The setting of the blow direction A and the blow direction B is effected by the openings OF1 and OF2 of the radial fan housing RDLG which are provided for this purpose, and by the positioning of the ends of the screen BL in relation to the openings OF1 and OF2.

As an alternative to the openings OF1 and OF2 in the radial fan housing RDLG, the openings can also be implemented or integrated in the screen BL itself.

In their respective left-hand halves, the figures FIG. 2A and FIG. 2B show the fan wheel of the radial fan and the cover thereof.

Also visible in FIG. 2C are possible installation locations of a drive AN, specifically in the left-hand or right-hand top corner of the opened radial fan.

Figure 2D:
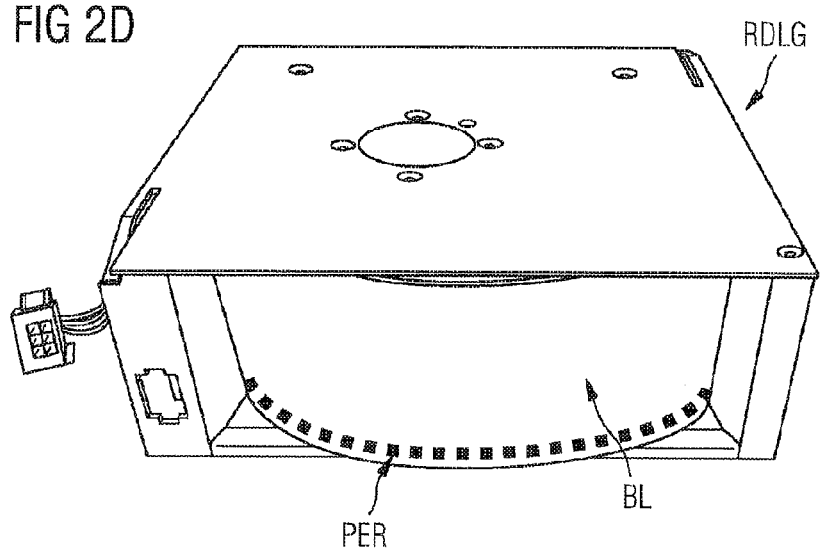

FIG. 2D shows an exemplary drive system of the rotatably mounted screen BL in the housing of the radial fan RDLG.

For this purpose the screen BL has a perforation PER at its lower edge, wherein a toothed wheel can engage in the perforation in a similar manner to the transport of a film in a camera.

The toothed wheel (not shown here) is driven by the drive AN which is arranged in a corner of the radial fan housing RDLG as a servomotor as described hereintofore.

The drive AN therefore engages in the perforation PER of the screen BL in the form of a toothed wheel gear, and carries the screen BL simultaneously.

Alternatively, a lever apparatus or a cam gear or a worm gear can also be used as drive AN.

The modified fan RDL can advantageously be integrated in any base station housing by simply replacing the fan.

Figure 4:
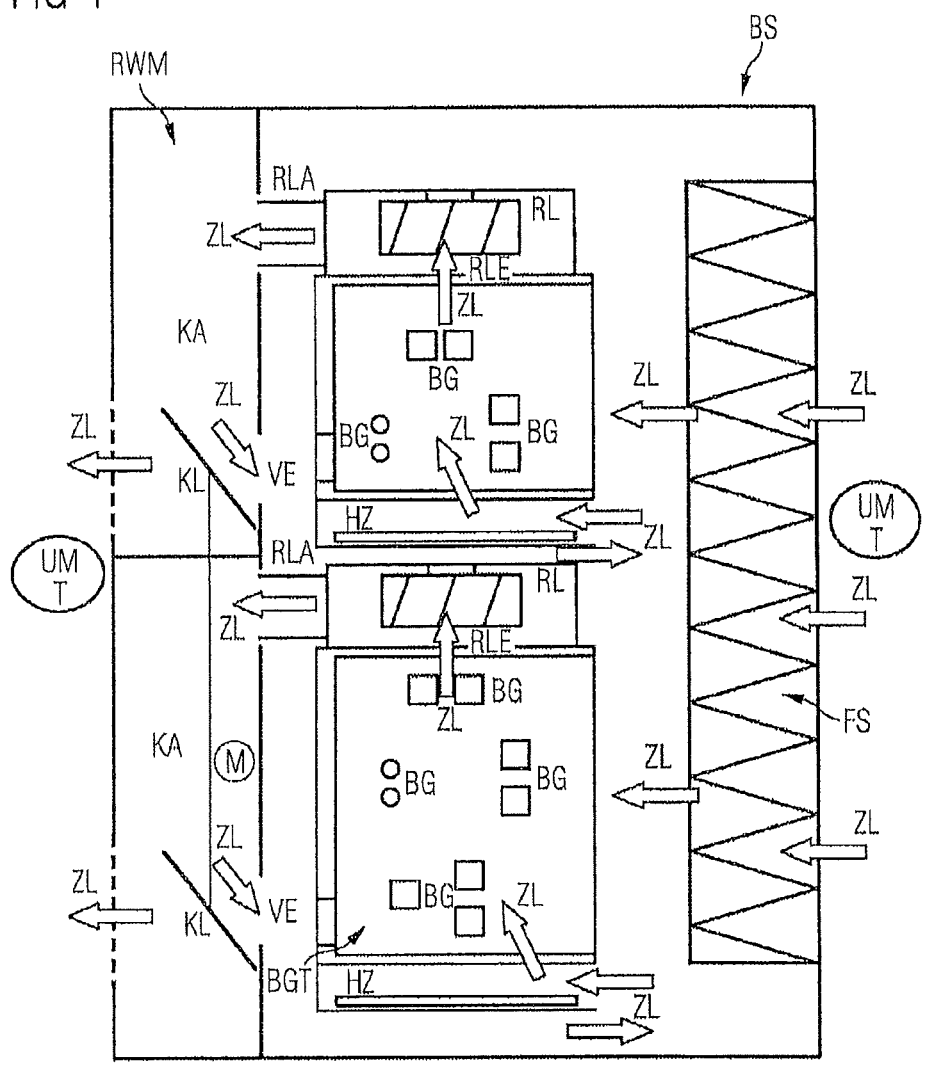
FIG. 4 is a plan view of the exemplary second air conditioning solution according to the related art and as described in the introduction.

It is therefore possible to install the arrangement retrospectively both in existing base station housings which, as shown in FIG. 3, do not have redirecting flaps, and in existing base station housings which, as shown in FIG. 4, have a redirecting flap between the chambers of the backplane and the interior of the base station housing.

The system also includes permanent or removable storage, such as magnetic and optical discs, RAM, ROM, etc. on which the process and data structures of the present invention can be stored and distributed. The processes can also be distributed via, for example, downloading over a network such as the Internet. The system can output the results to a display device, printer, readily accessible memory or another computer on a network.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV,* 358 F3d 870, 69 USPQ2d 1865 (Fed. Cir. 2004).

The invention claimed is:

1. An arrangement for air conditioning of subassemblies in a closed housing having an interior and an exterior, comprising:
    an air intake in the closed housing via which air for the air conditioning is guided into the interior of the closed housing;
    a fan inside the closed housing, by which the air for the air conditioning of the subassemblies is guided from the interior of the housing to the exterior thereof, having at least two fan outlets and a fan inlet; and
    a rotatably mounted screen, arranged in the interior of the closed housing, optionally guiding the air which is sucked into said fan via the fan inlet to at least one of the at least two fan outlets by a variably adjustable position of said rotatably mounted screen,
    wherein the rotatably mounted screen has two ends whose positions are adjustable along a rotation direction of the rotatably mounted screen.

2. The arrangement as claimed in claim 1, wherein said fan is a radial fan.

3. The arrangement as claimed in claim 2, wherein said rotatably mounted screen is rotatable about a longitudinal axis of said fan.

4. The arrangement as claimed in claim 3,
    wherein said rotatably mounted screen has a perforation, and
    wherein the arrangement further comprises a drive engaging the perforation in said screen and thereby rotating said rotatably mounted screen.

5. The arrangement as claimed in claim 4, wherein said rotatably mounted screen is a sealing panel having ends that at least partially open or close the at least two fan outlets, enabling variably adjustable blow directions to be selected for the air from said fan.

6. The arrangement as claimed in claim 4, wherein said rotatably mounted screen has at least two openings, enabling variably adjustable blow directions to be selected for the air from said fan by positioning the openings relative to the at least two fan outlets.

7. The arrangement as claimed in claim 4, wherein said drive is one of a toothed wheel gear, a lever apparatus, a cam gear and a worm gear coupled to said rotatably mounted screen.

8. A fan assembly for air conditioning of subassemblies in a closed housing having an interior and an exterior, comprising:
    a fan having a fan inlet and at least two fan outlets; and
    a rotatably mounted screen, arranged in the closed housing, positionable to produce a first blow direction and a second blow direction different from the first blow direction, such that air which is sucked into said fan via the fan inlet is optionally guided via at least one of the fan outlets in an adjustable manner,
    wherein the rotatably mounted screen has two ends whose positions are adjustable along a rotation direction of the rotatably mounted screen.

\* \* \* \* \*